(12) United States Patent
Kupich

(10) Patent No.: US 8,513,044 B2
(45) Date of Patent: Aug. 20, 2013

(54) METHOD FOR THE MANUFACTURING OF THIN FILM PHOTOVOLTAIC CONVERTER DEVICE

(75) Inventor: Markus Kupich, Buchs (CH)

(73) Assignee: Tel Solar AG, Trubbach (CH)

( * ) Notice: Subject to any disclaimer, the term of this patent is extended or adjusted under 35 U.S.C. 154(b) by 0 days.

(21) Appl. No.: 13/319,356

(22) PCT Filed: Jun. 1, 2010

(86) PCT No.: PCT/EP2010/057653
§ 371 (c)(1),
(2), (4) Date: Nov. 8, 2011

(87) PCT Pub. No.: WO2010/139698
PCT Pub. Date: Dec. 9, 2010

(65) Prior Publication Data
US 2012/0052614 A1    Mar. 1, 2012

Related U.S. Application Data

(60) Provisional application No. 61/184,391, filed on Jun. 5, 2009.

(51) Int. Cl.
*H01L 21/00* (2006.01)
*H01L 27/148* (2006.01)

(52) U.S. Cl.
USPC ............................................ 438/57; 257/233

(58) Field of Classification Search
USPC ...................... 257/21, 184, 233, 292; 438/48, 438/57
See application file for complete search history.

(56) References Cited

U.S. PATENT DOCUMENTS
2005/0172997 A1*   8/2005  Meier et al. .................. 136/261

FOREIGN PATENT DOCUMENTS
| WO | 03/061013 A1 | | 7/2003 |
| WO | WO 03/061013 | * | 7/2003 |
| WO | 2005/076370 A2 | | 8/2005 |
| WO | 2010/012674 A2 | | 2/2010 |

OTHER PUBLICATIONS

International Search Report for PCT/EP2010/057653 dated Dec. 21, 2010.
Written Opinion for PCT/EP2010/057653 dated Dec. 21, 2010.

\* cited by examiner

*Primary Examiner* — Calvin Lee
(74) *Attorney, Agent, or Firm* — Pearne & Gordon LLP

(57) ABSTRACT

So as to improve efficiency of a thin-film photovoltaic converter device, during manufacturing of which an intermediate product module is manufactured, which comprises deposition of at least one positively doped, at least one intrinsic and at least one negatively doped silicon-based layer, the addressed intermediate product module is subjected to an annealing step during which the module is subjected to a temperature of between 100° C. to 200° C. during a time span of half an hour to four hours.

16 Claims, No Drawings

METHOD FOR THE MANUFACTURING OF THIN FILM PHOTOVOLTAIC CONVERTER DEVICE

FIELD OF THE INVENTION

The present invention relates to improvement in the efficiency of thin-film, silicon-based solar cells or modules of such cells.

RELATED ART

Photovoltaic devices, photoelectric conversion devices or solar cells are devices which convert light, especially sunlight into direct current (DC) electrical power. For low-cost mass production thin film solar cells are being of interest since they allow using glass, glass ceramics or other rigid or flexible substrates as a base material (substrate) instead of crystalline or polycrystalline silicon. The solar cell structure, i. e. the layer sequence responsible for or capable of the photovoltaic effect is being deposited in thin layers. This deposition may take place under atmospheric or vacuum conditions. Deposition techniques are widely known in the art, such as PVD, CVD, PECVD, APCVD, . . . all being used in semiconductor technology.

Generally, a thin film photovoltaic device comprises a substrate, preferably a transparent vitreous substrate, an electrically conductive contact (first electrode) on the substrate, one or more semiconductor layers which generate an electric charge separation upon exposure to light, and a second electrically conductive contact (second electrode). The semiconductor layer or layers are positioned between said electrically conductive contacts. The semiconductor layers are deposited in a manner that provides for a junction and preferably the photovoltaic devices as manufactured according to the present invention contain at least one p-i-n junction, or at least one n-i-p junction although other types of semiconductor junctions can be utilized.

In other words, a thin-film solar cell generally includes a first electrode, one or more semiconductor thin-film p-i-n junctions, and a second electrode, which are successively stacked on a substrate. Each p-i-n junction or thin-film photoelectric conversion unit includes an i-type layer sandwiched between a p-type layer and an n-type layer (p-type=positively doped, n-type=negatively doped). The i-type layer, which is a substantially intrinsic semiconductor layer, occupies the most part of the thickness of the thin-film p-i-n junction. Photoelectric conversion occurs primarily in this i-type layer.

It is generally understood that when light, for example, solar radiation, impinges on a photoelectric device containing a p-i-n or n-i-p junction, electron-hole pairs are generated in the i-region. The "holes" from the generated pair flow toward the n-region and the electrons from the generated pair flow toward the p-region. The contacts are generally directly or indirectly in contact with the p- and n-regions or layers. Current will flow through an external circuit connecting these contacts as long as light continues to impinge on the photoelectric device thereby generating the electron-hole pairs.

SUMMARY OF THE INVENTION

It is an object of the present invention to provide for thin film photovoltaic converter devices which have an improved conversion efficiency.

This is achieved according to the present invention by the method for manufacturing a thin film photovoltaic converter device wherein an intermediate product module is manufactured comprising deposition of at least one positively doped, at least one intrinsic and at least one negatively doped silicon based layer and wherein the addressed intermediate product module is subjected to an annealing step which comprises subjecting the module to a temperature of between 100° C. to 160° C. during a time span of half an hour to four hours.

DETAILED DESCRIPTION OF THE INVENTION

Depending on the crystallinity of the i-type layer solar cells or photoelectric (conversion) devices are characterized as amorphous (a-Si) or microcrystalline (μc-Si) solar cells, independent of the kind of crystallinity of the adjacent p and n-layers. Microcrystalline layers are being understood, as layers comprising at least 50% (preferably >60%) of microcrystalline crystallites in an amorphous matrix.

Nowadays, so called tandem junction solar cells are of increasing interest. Tandem junction solar cells (tandem cells) are cells with at least two thin-film photoelectric conversion units stacked one on the other. This way a first photoelectric conversion unit with sensitivity in a first wavelength spectrum is combined with a second photoelectric conversion unit with sensitivity in a second wavelength spectrum. Known in the art is the combination of an a-Si cell having sensitivity in a shorter wavelength spectrum with a μc-Si cell using the longer wavelengths of the impinging spectrum.

Thus in one embodiment of the invention manufacturing of the intermediate product module comprises depositing at least one of an intrinsic hydrogenated microcrystalline Silicon layer and of at least one intrinsic hydrogenated amorphous silicon layer.

In the method of this invention the substrate used to form photovoltaic devices can be any suitable substrate for receiving the electrically conductive contact and semiconductor layers of the photovoltaic device. The substrate is generally flat and can be glass, glass-ceramics, ceramics or other glass-like material, a plastic such as a polyimide, or a metal film such as aluminum, steel, titanium, chromium, iron, and the like. Glass, particularly a highly transparent or transmissive glass is preferred. The substrate can be in any size and shape provided it can fit into the processing equipment used in the process of this invention. If larger substrate sizes are desired, the processing equipment as described herein will need to be sized accordingly. However, in order to meet the goal of efficiently producing solar cell modules, standardization is desirable. One size common in the market today is a 1.4 m$^2$ glass substrate with 1.1 m×1.3 m. This invention however is not limited to this size and may be successfully applied to other sizes and shapes, be it either rectangular or square.

The manufacturing process for a photoelectric conversion device is mostly a continuous or at least a semi-continuous process. By continuous, we mean a process whereby the substrate moves continuously along on a belt, on rollers, jig, moving framework, or other means for conveying the substrate from one operation or step in the process to the next operation or step. The means for conveying the substrate can comprise two or more different ways of conveying the substrate. The substrate can move horizontally or vertically, or nearly vertically (e.g. +/−10° from vertical) through the process.

The manufacturing process comprises continuous steps implying that the means for conveying the substrate conveys the substrate to and through each step or individual operation in the overall process. Other steps can be completed in a manner isolated from the rest of the processes or in what is many times referred to as a batch-type of process step with several substrates being subjected to essentially the same process conditions in parallel. When one or more (but not all) process steps are conducted so that it is isolated from the rest of the process steps, the overall process is referred to herein as a semi-continuous process.

An inline-process describes in this context is a sequence of process steps performed in dedicated process stations (carried out with essentially the same set of process parameters or completely different ones) which are being subsequently addressed by a substrate. In contrast to the continuous process an inline process will be performed in a common process environment, like one process system, e. g. under vacuum conditions.

The method according to the present invention resulting in photovoltaic converter devices of the addressed type not only with an improved performance but additionally at essentially the same cost by means of the dedicated annealing step is not limited to a specific type of thin film photovoltaic device, but is particularly suitable for the manufacturing of thin film photovoltaic devices comprising a tandem cell structure i.e. combining an a-Si and a µc-Si type of s solar cell as addressed above.

The term "handling" summarizes all work steps taken to hold, grip, move or transport at least one substrate outside processing or treatment systems. Handling means comprise transport robots, wheels, belt systems, elevators, lifters, grippers and all other means useful for transporting substrate of the kind described.

The term "heating" of the intermediate product module is understood as a process wherein the temperature of one or a plurality of modules is varied. Heating as used herein comprises raising a temperature gradually to a desired level and/or holding at a defined temperature level or controlling the temperature according to a defined profile, e. g. controlled ramp of a temperature or heating /cooling cycles between at least two temperature levels. Therefore such "heating" is also addressed by "subjecting to a temperature within a temperature range". Such heating may be accomplished under atmospheric conditions or under reduced pressure. Under atmospheric conditions an oven as known from the state of the art may be used, eventually with the aid of inert gases in order to avoid unwanted alterations of previously deposited layers. Under reduced pressure conditions radiation is preferred, e. g. by lamp heater elements. Preferably the emission spectrum of such lamps is chosen to match one or several absorption bands of the substrate to be heated. Of course the substrate can also be placed on a heating element itself and be heated by said contact. Control of the desired temperature is being achieved by measures known in the art, such as pyrometer, infrared detectors or other temperature sensors.

Thus in one embodiment of the present invention the annealing step is performed in vacuum atmosphere.

Cooling of substrates may be necessary during or after certain process steps in order to allow further processing and/or handling. Cooling can be achieved passively by leaving substrates to cool down under ambient atmospheric conditions or by active measures like exposing them to a stream of gas or contacting them with a cooling plate.

An embodiment of the method of this invention will now be described utilizing glass as the substrate material. However, it is to be understood that the invention is not limited in this respect; any of the above mentioned or other suitable substrates can be used.

The inventive manufacturing process—in the frame of first manufacturing an intermediate product module—comprises applying a front contact to the substrate. The front contact (F/C) comprises one or more layers of a suitable transparent conductive material. Typically, the front contact comprises one or more layer(s) of one or more transparent conductive oxides (TCO) such as tin oxide (SnO, $SnO_2$), indium-tin oxide (ITO), zinc oxide (ZnO) or others. The TCO layer(s) may be doped, e. g. with fluorine, aluminum, gallium, boron and/or the like.

The front contact F/C preferably comprising TCO and most preferably zinc oxide is deposited to a thickness that provides for a durable and effective front contact. Typically, it is deposited to a thickness of about 400 nm to about 6 µm, preferably 1 µm to 2 µm. The front contact is preferably deposited by one or more sources or methods such as chemical vapour deposition (CVD), low pressure chemical vapour deposition (LPCVD), physical vapour deposition (PVD) or by one or more sputtering techniques such a sputtering a metal oxide target or a metal target in an oxygen atmosphere. LPCVD of, for example, zinc oxide can be accomplished by directing at the substrate a mixture of a reactive zinc compound such as a dialkyl zinc, for example, diethyl zinc, and oxidizer like water and/or alcohols, optionally in the presence of a dopant such as diborane. The reactive zinc compound reacts with the water to form zinc oxide in situ and is deposited on the substrate.

The morphology of the TCO layer is preferably a textured morphology with uneven surface features resulting in a scattering into the adjacent semiconductor layers thereby increasing the effective travel path for the light, which again results in increased probability of absorption. Such textured surface thereby improves the efficiency of a respective photovoltaic device. Suitable texturing can be achieved by using an acid etch process such as by exposing the TCO layer to a diluted aqueous solution of hydrofluoric acid at a concentration of about 0.1 to about 1 weight percent acid, for about 15 to about 20 seconds, at about room temperature followed by a thorough rinsing with water to remove residual acid. Alternatively the texturing of the TCO layer is accomplished by ion etching. This can be accomplished by argon ion etching, alternatively by reactive ion etching with carbon tetrafluoride, oxygen or like compound or element which is used to form a reactive plasma atmosphere to plasma etch the TCO layer to achieve the desired morphology of the layer.

The TCO deposition process is being performed on an inline TCO deposition system commercially available as TCO 1200 system from Oerlikon Solar. It is preferable to deposit the front contact layer on the substrate at a temperature of about 100° C. to about 300° C. at a pressure of about 0.2 hPa to about 2 hPa.

Further handling transfers the substrate including its TCO F/C to the first laser treatment. The front contact is divided or patterned to provide for a collection of individual photovoltaic cells of the (later) photovoltaic module. The dividing of the front contact is preferably accomplished by removing strips of the deposited front contact. The spacing of these strips will determine the width of the individual cells on the photovoltaic module. To form these strips in the front contact, the front contact material can be removed by any suitable method such as chemical etching, laser ablation, mechanical stylus, wet or dry etch or a lift-off method or water jet ablation. Preferably the front contact material is removed by laser scribing.

Thus in one embodiment of the method according to the present invention, manufacturing of the intermediate product module—which then is subjected to the annealing step— comprises applying a front contact to a substrate of one or more layers of transparent conductive materials, preferably of one or more than one conductive oxides, preferably doped, and patterning the front contact, preferably by laser scribing, all before depositing the silicon based doped and intrinsic layers.

The laser selected as well as the wavelength of the laser light, the pulse-width of the laser, the laser beam shape and the repetition rate are selected to efficiently remove the front contact in the region of the strips. For example, particularly when the front contact is the preferred zinc oxide, the laser is preferably an excimer, i.e., ArF, XeCl, XeF, KrF, ArCl, or a solid state Nd:YAG, Nd:YLF, or Nd:YVO$_4$ laser operating at a wavelength of about 190 nm to about 1.200 nm. Commercially available optics can be used to shape the laser beam to the desired shape.

The next deposition step in the process is to apply an amorphous silicon-containing thin film semiconductor layer stack with p-i-n or n-i-p amorphous silicon thin film layers. As used herein, p-i-n means that the p-layer of the p-i-n junction is made first followed by the i- and then the n-layers. For a n-i-p junction, it is the n-layer that is made first followed by the i- then the p-layer. The amorphous silicon containing thin film semiconductor can comprise hydrogenated amorphous silicon, hydrogenated amorphous silicon carbon or hydrogenated amorphous silicon germanium. For the formation of a p-i-n junction, the positively doped (p-doped) amorphous silicon p-layer of the amorphous silicon semiconductor is deposited on the TCO front contact. The p-layer can be positively doped with diborane ($B_2H_6$), $BF_3$ or trimethylboron (TMB) or other boron-containing compounds. An amorphous silicon, undoped, active intrinsic i-layer can be deposited on the p-layer and a negatively doped (n-doped) amorphous silicon p-layer is deposited on the i-layer. The n-layer positioned on the i-layer can comprise amorphous silicon carbon or amorphous silicon negatively doped with phosphine ($PH_3$) or some other phosphorous-containing compound.

After the p-type layer has been formed to a thickness in the order of about 3 nm to about 25 nm, the intrinsic layer is applied. The intrinsic layer is applied to a thickness suitably on the order of about 100 nm to about 500 nm. After the intrinsic layer is applied an n-doped layer is applied. An n-type dopant, such as phosphine is added to, for example, a silane feed in order to form an n-type silicon layer suitably having a thickness of about 3 nm to about 50 nm, preferably 10 nm to 30 nm.

Thus in one further embodiment of the present invention manufacturing of the intermediate product module further comprises depositing of one of the positively doped or of one of the negatively doped layers after applying and patterning the front contact, thereupon, one of the intrinsic layers substantially of amorphous silicon, and thereupon one of the negatively doped or of one of the positively doped layers, respectively.

The deposition of said p-i-n junction in a manufacturing process according to the invention is being accomplished in a KAI 1200 PECVD system commercially available from Oerlikon Solar. This system is construed according to the batch principle with up to 3 stacks, each stack accommodating up to 20 substrates with 1.1 m×1.3 m size. All substrates in a stack (batch) are being processed in parallel.

As mentioned, Plasma Enhanced Chemical Vapor Deposition (PECVD) is widely used in the art for depositing thin film silicon layers. This can be achieved in system following the single substrate processing approach, e. g. a cluster tool. Designs with single process chambers accommodating several substrates as well as multiple chamber approaches as well as combinations thereof are being known in the art.

Alternatively low pressure CVD (LPCVD) can be used. Other methods or techniques for depositing the amorphous layers include deposition using electron cyclotron resonant microwaves, hot wire CVD, cascaded arc plasmas, dc hollow cathode, tuned antenna microwaves, or RF hollow cathode. One or more sputtering techniques (PVD) can also be used to apply the amorphous semiconductor silicon layers having a p-i-n or n-i-p junction. Depending on the method used to deposit the amorphous layers different feeds can be used. For example, for the glow discharge type of methods, silane and silane/hydrogen mixtures can be used. With PVD, solid silicon along with argon/hydrogen mixtures can be used. For the hollow cathode technique, a silicon target and silane, or silane and hydrogen can be used.

In a further, optional step an intermediate layer is being applied on top of the a-Si layer stack. This intermediate layer can be construed to further improve the optical and electrical behaviour of the (later) tandem cell. This matching may be achieved by depositing a thin dielectric layer in a PECVD system, e. g. $SiO_x$ or doped hydrogenated $SiO_x$ like $n(SiO_x:H)$.

Thus in a further embodiment of the invention there is applied upon the one respectively negatively doped or positively doped layer as just addressed, an intermediate layer, which is preferably a dielectric intermediate layer, preferably of addressed material.

The following will describe the application of the second, microcrystalline semiconductor layer stack. This stack again comprises p-i-n or n-i-p microcrystalline silicon thin film layers; the order and sequence of layers has the same meaning as described above. The microcrystalline silicon containing thin film semiconductor can comprise hydrogenated microcrystalline silicon, hydrogenated microcrystalline silicon carbon or hydrogenated microcrystalline silicon germanium. For the formation of a p-i-n junction, the positively doped (p-doped) microcrystalline silicon p-layer of the microcrystalline silicon semiconductor is deposited on the previously deposited a-Si layer stack or the intermediate layer as mentioned above. The p-layer can be positively doped with diborane ($B_2H_6$), $BF_3$ or other boron-containing compounds. A microcrystalline silicon, undoped, active intrinsic i-layer can be deposited on the p-layer and a negatively doped (n-doped) microcrystalline silicon n-layer is deposited on the i-layer. The n-layer positioned on the i-layer can comprise microcrystalline silicon carbon or microcrystalline silicon negatively doped with phosphine ($PH_3$) or some other phosphorous-containing compound.

After the p-type layer has been formed to a thickness in the order of about 3 nm to about 50 nm, preferably 10 nm to 30 nm, the intrinsic layer is applied. The intrinsic layer is applied to a thickness in the order of about 500 nm to about 2.5 μm, preferably between 1 μm and 2 μm. After the intrinsic layer is applied an n-doped layer is applied. An n-type dopant, such as phosphine is added to, for example, a silane feed in order to form an n-type silicon layer suitably having a thickness of about 5 nm to about 50 nm, preferably between 10 nm to 30 nm.

The deposition of said p-i-n junction in a manufacturing process according to the invention is being accomplished in a KAI 1200 PECVD system commercially available from Oerlikon Solar. This system is construed according to the batch principle with up to 3 stacks, each stack accommodating up to 20 substrates with 1.1 m×1.3 m size. All substrates in a stack (batch) are being processed in parallel.

Thus in one embodiment of the invention manufacturing of the intermediate product module further comprises depositing of one further of the negatively doped or of one further of the positively doped layers, thereupon one of the intrinsic layers substantially of microcrystalline silicon, and thereupon, respectively, one of the positively doped or of one of the negatively doped layers.

The next step in the process enables the later contacting between the patterned front contact and the later applied back contact by removing all layers except for the front contact in a strip- or point-like pattern. In a second laser patterning step, the so called pattern 2 scribe of the semiconductor layer stack takes place. The front contact layer shall not being affected by this scribe. This is being achieved by choosing an appropriate wavelength of the scribing laser and selecting appropriate laser pulses and pulse energy. Size and design of those removal patterns will be chosen such that appropriate contacting properties can be realized.

Thus in a further embodiment of the invention subsequent to depositing the one further of the positively doped or of one further of the negatively doped layers, all layers except the front contact are patterned, preferably by a further laser scribing.

In the next process step a back contact B/C, preferably a transparent conductive oxide such as zinc oxide, tin oxide, or indium-tin oxide is applied (deposited) on top of the silicon layers. This zinc oxide or other TCO layer is preferably applied to a thickness of about 60 nm to about 200 nm. This zinc oxide or TCO layer is preferably applied by a commercially available TCO 1200 LPCVD system as supplied by Oerlikon Solar.

Alternatively a TCO can be applied by reactively sputtered zinc or other metal in the presence of oxygen gas to form zinc or other metal oxide, doped with aluminum or boron, if necessary. Other methods for applying said back contact include LPCVD, AC sputtering, pulsed sputtering or rf sputtering.

In an alternative embodiment a metallic back contact (metal B/C) can be applied by sputtering, evaporation or other means. Such a metal B/C can combine the function of a back reflector and back contact.

Thus in one embodiment of the invention, manufacturing the intermediate product module includes deposition of a back contact or of a back contact and of a reflector or of a back contact/reflector, generically after depositing the silicon based layers.

In a more specific embodiment of the invention wherein further embodiment of the invention subsequent to depositing the one further of the positively doped or of one further of the negatively doped layers, all layers except the front contact are patterned, preferably by a further laser scribing, manufacturing of the intermediate product module further comprises deposition of a back contact or of a back contact and reflector, and preferably further comprises patterning all layers except said front contact, preferably by still further laser scribing and further preferably comprises contacting.

Next step in the process is to again remove strips of the back contact and the silicon layers (amorphous, microcrystalline plus evtl. interlayer) parallel to the strips formed in the front contact. This third laser patterning step is also called pattern 3 scribe of the layer stack. The front contact layer is not being scribed. This is being achieved by choosing an appropriate wavelength of the scribing laser and selecting appropriate laser pulses and pulse energy.

As mentioned above the back contact can be realized as a metal B/C which can include both functions B/C and back reflector as well as a TCO, which will by definition not reflect the light having passed through the semiconductor stack without having been absorbed. In order to allow this residual light to be absorbed the backreflector has to be applied. Depending on this choice, the initial back end process (B/E process) will vary.

Thus in a further embodiment of the invention, manufacturing of the intermediate product module further comprises deposition of a back contact or of a back contact and reflector, and preferably further comprises patterning all layers except the front contact, preferably by still further laser scribing and preferably still further comprises contacting as also addressed subsequently.

A further step in the manufacturing process of a solar cell is namely the so called contacting. This is being achieved by applying a conductive strip or strips, also called bus bars, which function as electrical conduits or wires from the photovoltaically active portions of the photovoltaic device to, preferably, a central location on the substrate, so the photovoltaic device can be connected to the device or system using the electric current generated by the photovoltaic device.

In the following step—and if the back contact does not also act as reflector—a reflector is being placed upon the back contact including the contact ribbons. This reflector can be made of any suitable material, preferably white paint. This white paint is preferably being applied by a screen printing method (C05), alternatively by spraying or other dispensing. The paint may be a UV curable one or solvent based.

Usually this white, paint-based reflector will be cured in order to accelerate processing. This curing can be realized as exposing to UV light, heat or vacuum.

Thus in a further embodiment of the invention manufacturing of the intermediate product module further comprises deposition of a back contact, then performing patterning all layers except the front contact, preferably by a still further laser scribing, contacting and then applying at least a part of a reflector.

As addressed below the annealing step may be applied after one layer of a reflector has been applied, and, after such annealing a further layer of the reflector may be applied. Such intermittent reflector layer deposition and annealing may be repeated twice or more. Therefore the intermediate product module which is subjected to the annealing step may comprise the reflector or a part thereof.

Still in a further embodiment manufacturing the intermediate product module comprises deposition of the back reflector of white paint.

In order to enhance efficiency of the overall thin film photovoltaic device or module according to the invention, an annealing step is performed at this stage, that is preferably
 a) after having deposited the back contact or the back contact also effective as back reflector and having performed respective patterning and contacting or
 b) after having deposited the back contact and having performed respective patterning and contacting and before and/or during and/or after deposition of the reflector.

It has been found that heating up a module to a temperature in the range of 100 to 160° C. for a time in the range half an hour up to four hours results in a relevant rise of initial and stabilized efficiency. For example an average rise of 10 W could be constantly monitored on modules having initial power levels in the range 120 to 140 W (based on 1.4 m$^2$ area) prior to the annealing step. It has been found that by changing temperature and/or heating time even better results may be achieved.

Depending on process steps and fabrication architecture peculiarities such a thermal treatment can be performed at any stage after deposition of the silicon layer stack as described above; preferably after the back contact has been deposited.

Thus in the one embodiment of the invention manufacturing the intermediate product module includes deposition of a back contact or of a back contact and of a reflector, or of a back contact and reflector.

In a further embodiment of the invention such an annealing step may be performed in a vacuum atmosphere as well as at ambient or reduced pressure with or without presence of gaseous species as for example Ar, N, etc.

Thus in such embodiment the annealing step is performed in an atmosphere containing selected gaseous species, preferably at least one of Ar and N.

In a preferred embodiment the screen printing of the white back reflector and the subsequent heating/curing step are being performed more than once. By doing that an annealing effect on the module can be achieved; additionally a further advantage can be noticed: having twice or three times more white paint at disposal in the back reflector produces better reflection and therefore also helps to obtain a higher module power output.

Thus in one embodiment of the invention the back reflector or back contact and reflector is deposited by repeatedly depositing a respective layer and performing one of said annealing steps.

In case the white colour screen printing and annealing step is being replaced by an application of a white lamination foil then the annealing step has to be performed separately.

In case of deposition of the back reflector by sputtering the annealing effect can be achieved by keeping the substrate at elevated temperature as previously stated.

Thus in one embodiment of the invention deposition of the back reflector is performed by sputter deposition and the annealing step is performed during sputter deposition.

Sample modules as listed in the table below have undergone the following treatment. The silicon layer stack and the back contact have been accomplished on a glass substrate, however the white paint based back reflector has not yet been applied on the backside. For measuring the module's initial power a removable, ideally white reflector (white PVC plate with >95% total reflection in the wavelength region from 300 nm to 1200 nm) has been arranged adjacent to the back contact for the time of the power measurement only. This way the basic output value can be determined (also used for all values in the table below). Then a white reflector of white paint has been applied on top of the back reflector with an effective thickness of approximately 0.025 mm by screen printing. After curing the white paint for about 30 Minutes at a temperature of 140° C. the samples' power has been measured again. Although the white-paint back reflector is not completely opaque (i. e. some unreflected light is lost), a considerable gain in power can be demonstrated, as shown in column A below. In order to collect even this residual light, the ideally white reflector as used for the very first measurement has been additionally installed. The results of said combined reflection and the additionally gain in power is between 0.4 and 0.5%, as shown in column B. The power increase from white-paint back reflector including annealing (column A) to white-paint back reflector with additional ideal white reflector (column B) clearly shows that the optical properties of the white-paint reflector are inferior to the optical properties of the ideal white reflector. So, the power gain from the reference measurement with ideal white reflector to the white-paint back reflector (column A) is due to the annealing effect occurring during curing of the white-paint back reflector.

Annealing the module with the white-paint back reflector further for 3 hours at 120° C. and again measuring them with the movable ideally white reflector, a further gain in power can be achieved, as demonstrated in column C.

| Sample No. | A [%] | B [%] | C [%] |
|---|---|---|---|
| 533-3 | 8.4 | 8.8 | 10.1 |
| 533-4 | 7.3 | 7.9 | 8.1 |
| 533-5 | 7.0 | 7.5 | 11.2 |
| 533-7 | 5.8 | 6.2 | 6.8 |
| 533-8 | 6.9 | 7.5 | |
| 533-9 | 7.2 | 7.6 | |

As the results show, thermally annealing photovoltaic modules plus optionally improved back reflectors will result in a considerable gain in power output. However, for economically producing photovoltaic cells the cost of individual process steps has to be taken into account. An annealing process of several hours is energy and time consuming and requires storage space with controlled environmental conditions. Too high temperatures raise safety issues, may require a cooling step prior to later process steps, complicate handling of the substrates and may damage the photovoltaic cell structure and/or induce unwanted diffusion effects. If the annealing conditions are not met, the potential gain of power output is partially wasted. Long lasting experiments of the inventors have shown, that a thermal treatment of 0.5 to 4 hours, preferably 0.5 to 2.5 hours at temperatures between 100° C. and 200° C., preferably between 120° C. to 160° C. is the best compromise between economical operation, effort in terms of production equipment for thermal treatment and efficiency (power) gain.

All the above mentioned coating steps have affected the whole area including the edges of the substrates. These edge areas however will later be exposed to atmospheric conditions and therefore measures have to be taken in order to protect the cell structure against moisture, oxidation or delamination or alike. A prerequisite for that again is to remove unnecessary metal and semiconductor material from those edge regions. This process, called edge-scribing, is typically being done using a mechanical abrasion means, like sandblasting, grinding, shaving, water jet, $CO_2$ or other mechanical or chemical means. Alternatively optical methods, like laser ablation may be used. This process is necessary for both metal B/C or TCO+white reflector. In performing this, a narrow strip of the metal and other layers deposited are removed around the perimeter of the photovoltaic device to "edge-isolate" the photovoltaic device. The strip for the edge isolation is generally placed about 0 to about 10 cm from the edge of the device for most applications. However, since material cost are of the essence, one will try to use as much substrate area for cell structure, however will be forced to provide sufficient space for isolation purposes.

In order to achieve the above mentioned stability against later environmental influences, the solar cell structure will be encapsulated. A first element of this environmental protection is a foil intended to seal the cell structure. This foil could be ethylene vinyl acetate (EVA), Polyvinylbutyral (PVB) or other suitable plastic material, eventually coloured to further enhance reflection. The foil can be chosen from commercially available products, especially in view of moisture permeability.

The final protection against environmental influences will be achieved by a back glass, which will complete the sandwich of electrically conductive layers, semiconductor layers, reflectors, foils and electrical connecting means. Glass is preferred due to its availability, long-term-stability and barrier properties. Semi-tempered glass, tempered safety glass, chemically toughened glass or simple float glass may be used. The glass may be further coated or painted. Alternatively rigid plastic can be used as well as honey comb structures, e. g. based on carbon fibres.

In order to allow later conducting the photocurrent generated by the Solar Cell to the out side world, a cross contacting has to be accomplished. This will usually be done by soldering or welding flexible wires or ribbons to the previously manufactured bus bars. The back glass is arranged in close relationship to the cell structure (on the front glass) and foil. The joining of said elements takes place by lamination. Heat and pressure connect front and back glass during the lamination process.

As one of the last steps control electronics are placed at the solar module. Such electronics may comprise on-board inverters, control display means and/or function indicators, connecting points for electrical maintenance, connectors. Instead of mounting this electronics box (J-Box) at the backside, preferably covering the drilling holes, said connection point can be arranged at the edges or any other area of the solar cell, e. g. in a frame like device.

The invention claimed is:

1. A method for manufacturing a thin film photovoltaic converter device, comprising:
    manufacturing an intermediate product module comprising the steps of:
        depositing at least one positively doped, at least one intrinsic, and at least one negatively doped silicon based layer, and
        subjecting said intermediate product module to annealing step comprising subjecting said module to a temperature of between 100° C. to 200° C. during a time span of half an hour to four hours,
    wherein manufacturing said intermediate product module further comprises, after said depositing of said silicon based layers, depositing a back contact and a reflector, or a back contact/reflector, by sputtering, said annealing step being performed during said depositing by sputtering.

2. A method for manufacturing a thin film photovoltaic converter device, comprising:
    manufacturing an intermediate product module comprising the steps of:
        depositing at least one positively doped, at least one intrinsic, and at least one negatively doped silicon based layer, and
        subjecting said intermediate product module to one of a plurality of annealing steps, each of the annealing steps comprising subjecting said module to a temperature of between 100° C. to 200° C. during a time span of half an hour to four hours,
    wherein said manufacturing said intermediate product module further comprises, after said depositing of said silicon based layers, repeatedly depositing a back contact and a reflector, or a back contact/reflector, one of the annealing steps being performed after each of the repeated depositions.

3. The method of claim 1, further comprising:
    depositing said back reflector of white paint.

4. The method of claim 1, wherein said annealing step is performed in a vacuum atmosphere.

5. The method of claim 1, wherein said annealing step is performed in an atmosphere containing selected gaseous species.

6. The method of claim 5, wherein said gaseous species comprises at least one of Ar and N.

7. The method of claim 1, wherein said manufacturing of said intermediate product module further comprises depositing at least one of an intrinsic hydrogenated microcrystalline Silicon layer and of at least one intrinsic hydrogenated amorphous silicon layer.

8. The method of claim 1, wherein said manufacturing of said intermediate product module further comprises patterning all layers except said front contact by laser scribing and further comprises contacting.

9. The method of claim 1, wherein said manufacturing of said intermediate product module further comprises applying a front contact to a substrate of one or more than one layer of transparent conductive materials and patterning said front contact.

10. The method of claim 9, wherein the transparent conductive materials comprise one or more doped conductive oxides, and
    wherein said patterning is performed by laser scribing.

11. The method of claim 9, wherein said manufacturing of said intermediate product module further comprises depositing of one of said positively doped or of one of said negatively doped layers after applying and patterning said front contact, thereupon one of said intrinsic layers substantially of amorphous silicon, and thereupon one of said negatively doped or of one of said positively doped layers.

12. The method of claim 11, wherein said manufacturing of said intermediate product module further comprises applying an intermediate layer.

13. The method of claim 11, wherein said manufacturing of said intermediate product module further comprises depositing of one further of said negatively doped or of one further of said positively doped layers, thereupon one of said intrinsic layers substantially of microcrystalline silicon, and thereupon, respectively, one further of said positively doped or of one further of said negatively doped layers.

14. The method of claim 13, wherein said manufacturing of said intermediate product module further comprises patterning subsequently all layers except said front contact by further laser scribing.

15. The method of claim 13, wherein said manufacturing of said intermediate product module further comprises performing patterning of all layers except said front contact after the repeated depositions of the back contact and the reflector or the back contact/reflector.

16. The method of claim 15, wherein said manufacturing of said intermediate product module further comprises deposition of a back contact, then performing patterning all layers except said front contact by laser scribing, contacting and then applying at least a part of a reflector.

* * * * *

UNITED STATES PATENT AND TRADEMARK OFFICE
CERTIFICATE OF CORRECTION

PATENT NO. : 8,513,044 B2
APPLICATION NO. : 13/319356
DATED : August 20, 2013
INVENTOR(S) : Markus Kupich It is certified that error appears in the above-identified patent and that said Letters Patent is hereby corrected as shown below:

In the Claims
In Claim 3, column 12, line 1, replace "claim 1" with -- claim 2 --
In Claim 4, column 12, line 3, replace "claim 1" with -- claim 2 --
In Claim 5, column 12, line 5, replace "claim 1" with -- claim 2 --
In Claim 7, column 12, line 10, replace "claim 1" with -- claim 2 --
In Claim 8, column 12, line 15, replace "claim 1" with -- claim 2 --
In Claim 9, column 12, line 19, replace "claim 1" with -- claim 2 --

Signed and Sealed this
Twenty-ninth Day of October, 2013

Teresa Stanek Rea
*Deputy Director of the United States Patent and Trademark Office*